(12) United States Patent
Zohni et al.

(10) Patent No.: US 8,810,028 B1
(45) Date of Patent: Aug. 19, 2014

(54) INTEGRATED CIRCUIT PACKAGING DEVICES AND METHODS

(75) Inventors: Nael Zohni, Campbell, CA (US); Kumar Nagarajan, San Jose, CA (US); Ronilo Boja, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 449 days.

(21) Appl. No.: 12/828,166

(22) Filed: Jun. 30, 2010

(51) Int. Cl.
H01L 23/04 (2006.01)

(52) U.S. Cl.
USPC ........... 257/730; 257/713; 257/706; 257/690; 438/108

(58) Field of Classification Search
USPC ........................................ 257/713
See application file for complete search history.

(56) References Cited

U.S. PATENT DOCUMENTS

| | | |
|---|---|---|
| 3,846,824 A | 11/1974 | Bell |
| 3,972,062 A | 7/1976 | Hopp |
| 4,541,005 A | 9/1985 | Hunter et al. |
| 4,748,538 A | 5/1988 | Tsuji |
| 4,849,856 A | 7/1989 | Funari et al. |
| 5,028,984 A | 7/1991 | Ameen et al. |
| 5,031,025 A | 7/1991 | Braun et al. |
| 5,105,259 A | 4/1992 | McShane et al. |
| 5,168,432 A | 12/1992 | Murphy et al. |
| 5,206,792 A | 4/1993 | Reynolds |
| 5,258,576 A | 11/1993 | Neumann et al. |
| 5,289,337 A | 2/1994 | Aghazadeh et al. |
| 5,297,333 A | 3/1994 | Kusaka |
| 5,406,117 A | 4/1995 | Dlugokecki et al. |
| 5,434,745 A | 7/1995 | Shokrgozar et al. |
| 5,436,407 A | 7/1995 | Fehr et al. |
| 5,455,456 A | 10/1995 | Newman |
| 5,459,352 A | 10/1995 | Layton et al. |
| 5,468,910 A * | 11/1995 | Knapp et al. .................. 174/530 |
| 5,473,512 A * | 12/1995 | Degani et al. ................. 361/760 |
| 5,473,814 A | 12/1995 | White |
| 5,504,652 A | 4/1996 | Foster et al. |
| 5,533,256 A | 7/1996 | Call et al. |
| 5,552,635 A | 9/1996 | Kim et al. |

(Continued)

FOREIGN PATENT DOCUMENTS

| | | |
|---|---|---|
| JP | 58140931 | 2/1985 |
| JP | 60031253 A2 | 2/1985 |

(Continued)

OTHER PUBLICATIONS

Emoto, Y., et al., "Development of Molded TAB Package Technology," Nippon Steel Technical Report, No. 56, Jan. 1993, pp. 1-6.

(Continued)

Primary Examiner — Steven Loke
Assistant Examiner — David Goodwin
(74) Attorney, Agent, or Firm — Brian A. Carlson; Steven Slater; John J. King

(57) ABSTRACT

Integrated circuit packaging devices and methods are disclosed. An embodiment package lid is formed from a single piece of material. The lid includes a planar rectangular main body having a bottom surface, and a leg disposed at each corner of the main body and within a perimeter of the main body. Each leg has a wall projecting downwardly from the main body and a non-planar bottom surface disposed at a bottom of the wall. The non-planar bottom surface of the leg faces a same direction as the main body bottom surface.

15 Claims, 12 Drawing Sheets

FIG. 2c

(56) References Cited

U.S. PATENT DOCUMENTS

| | | | |
|---|---|---|---|
| 5,583,377 A | 12/1996 | Higgins, III | |
| 5,641,987 A | 6/1997 | Lee | |
| 5,728,247 A | 3/1998 | Büstrich et al. | |
| 5,736,785 A | 4/1998 | Chiang et al. | |
| 5,745,344 A | 4/1998 | Baska et al. | |
| 5,770,478 A | 6/1998 | Iruvanti et al. | |
| 5,825,087 A | 10/1998 | Iruvanti et al. | |
| 5,834,839 A | 11/1998 | Mertol | |
| 5,849,606 A * | 12/1998 | Kikuchi et al. | 438/108 |
| 5,889,323 A | 3/1999 | Tachibana | |
| 5,895,233 A | 4/1999 | Higashi et al. | |
| 5,898,224 A | 4/1999 | Akram | |
| 5,903,436 A | 5/1999 | Brownell et al. | |
| 5,949,655 A | 9/1999 | Glenn et al. | |
| 5,956,576 A | 9/1999 | Toy et al. | |
| 5,990,418 A | 11/1999 | Bivona et al. | |
| 5,998,862 A | 12/1999 | Yamanaka | |
| 6,016,006 A | 1/2000 | Kolman et al. | |
| 6,037,193 A | 3/2000 | Interrante et al. | |
| 6,049,656 A | 4/2000 | Kim et al. | |
| 6,069,023 A | 5/2000 | Bernier et al. | |
| 6,075,289 A | 6/2000 | Distefano | |
| 6,104,093 A | 8/2000 | Caletka et al. | |
| 6,118,177 A * | 9/2000 | Lischner et al. | 257/706 |
| 6,166,434 A | 12/2000 | Desai et al. | |
| 6,214,643 B1 | 4/2001 | Chiu | |
| 6,225,694 B1 | 5/2001 | Terui | |
| 6,225,695 B1 | 5/2001 | Chia et al. | |
| 6,249,046 B1 | 6/2001 | Hashimoto | |
| 6,262,481 B1 | 7/2001 | Wang et al. | |
| 6,271,058 B1 | 8/2001 | Yoshida | |
| 6,274,927 B1 | 8/2001 | Glenn | |
| 6,288,900 B1 | 9/2001 | Johnson et al. | |
| RE37,554 E | 2/2002 | Brunner et al. | |
| 6,352,195 B1 | 3/2002 | Guthrie et al. | |
| 6,354,485 B1 | 3/2002 | Distefano | |
| 6,380,621 B1 | 4/2002 | Ando et al. | |
| 6,413,353 B2 | 7/2002 | Pompeo et al. | |
| 6,462,405 B1 | 10/2002 | Lai et al. | |
| 6,469,897 B2 | 10/2002 | Ho et al. | |
| 6,483,702 B1 | 11/2002 | Lofland | |
| 6,501,171 B2 | 12/2002 | Farquhar et al. | |
| 6,504,096 B2 | 1/2003 | Okubora | |
| 6,538,320 B1 | 3/2003 | Tosaya et al. | |
| 6,573,590 B1 | 6/2003 | Radu et al. | |
| 6,630,743 B2 | 10/2003 | Magnuson et al. | |
| 6,670,223 B2 | 12/2003 | Gaynes et al. | |
| 6,681,482 B1 | 1/2004 | Lischner et al. | |
| 6,693,748 B1 | 2/2004 | Fujimoto et al. | |
| 6,713,863 B2 | 3/2004 | Murayama et al. | |
| 6,737,298 B2 * | 5/2004 | Shim et al. | 438/108 |
| 6,762,796 B1 | 7/2004 | Nakajoh et al. | |
| 6,770,513 B1 | 8/2004 | Vikram et al. | |
| 6,819,566 B1 | 11/2004 | Danovitch et al. | |
| 6,849,942 B2 | 2/2005 | Lin et al. | |
| 6,853,068 B1 | 2/2005 | Djekic | |
| 6,856,015 B1 | 2/2005 | Huang et al. | |
| 6,864,565 B1 | 3/2005 | Hool et al. | |
| 6,882,535 B2 | 4/2005 | Labanok et al. | |
| 6,919,630 B2 * | 7/2005 | Hsiao | 257/706 |
| 6,933,537 B2 | 8/2005 | Yee et al. | |
| 6,949,414 B2 | 9/2005 | Lo et al. | |
| 6,952,050 B2 | 10/2005 | Kwon et al. | |
| 6,953,990 B2 | 10/2005 | Gallup et al. | |
| 7,012,326 B1 | 3/2006 | Wu et al. | |
| 7,057,276 B2 | 6/2006 | Lin et al. | |
| 7,126,217 B2 | 10/2006 | Chiu et al. | |
| 7,135,769 B2 | 11/2006 | Ni et al. | |
| 7,141,886 B2 | 11/2006 | Dimaano et al. | |
| 7,187,077 B1 | 3/2007 | Nagarajan | |
| 7,196,414 B2 | 3/2007 | Lin et al. | |
| 7,199,467 B2 | 4/2007 | Yoshimura | |
| 7,203,072 B2 * | 4/2007 | Chen et al. | 361/760 |
| 7,205,651 B2 | 4/2007 | Do et al. | |
| 7,327,027 B2 | 2/2008 | Houle et al. | |
| 7,342,298 B1 | 3/2008 | Zhang | |
| 7,358,106 B2 | 4/2008 | Potter | |
| 7,388,284 B1 | 6/2008 | Zhang | |
| 7,402,906 B2 | 7/2008 | Rahman Khan et al. | |
| 7,429,501 B1 | 9/2008 | Wu et al. | |
| 7,473,583 B1 | 1/2009 | Nagarajan | |
| 7,554,190 B2 | 6/2009 | Macris et al. | |
| 7,575,956 B2 * | 8/2009 | Ararao et al. | 438/123 |
| 7,986,038 B2 * | 7/2011 | Kariyazaki | 257/704 |
| 2004/0007780 A1 | 1/2004 | Hundt et al. | |
| 2004/0174682 A1 * | 9/2004 | Lin et al. | 361/705 |
| 2004/0238947 A1 | 12/2004 | Rumer et al. | |
| 2005/0077614 A1 | 4/2005 | Chengalva et al. | |
| 2005/0112796 A1 * | 5/2005 | Ararao et al. | 438/106 |
| 2005/0168952 A1 | 8/2005 | Chen et al. | |
| 2006/0060952 A1 | 3/2006 | Yuan et al. | |
| 2008/0001277 A1 | 1/2008 | Wen et al. | |
| 2010/0109152 A1 * | 5/2010 | Kariyazaki | 257/704 |

FOREIGN PATENT DOCUMENTS

| | | |
|---|---|---|
| JP | 60160146 A | 8/1985 |
| JP | 03048446 | 3/1991 |
| JP | 08211913 | 2/1998 |
| WO | WO 00/69239 | 11/2000 |

OTHER PUBLICATIONS

U.S. Appl. No. 12/607,019, filed Oct. 27, 2009, Dosdos, S. Gabriel R and Kim, Dong W., Xilinx, Inc., 2100 Logic Drive, San Jose, CA, USA.

Xilinx, Inc., "The Programmable Logic Data Book 1999," pp. 1-62, available from Xilinx, Inc., 2100 Logic Drive, San Jose, CA 95124.

U.S. Appl. No. 10/648,118, filed Aug. 25, 2003, Ghee, et al., Xilinx, Inc., 2100 Logic Drive, San Jose, CA 95124.

U.S. Appl. No. 11/123,499, filed May 5, 2005, Hoang, Lan H., Xilinx, Inc., 2100 Logic Drive, San Jose, CA 95124.

U.S. Appl. No. 11/823,376, filed Jun. 26, 2007, Dosdos, et al., Xilinx, Inc., 2100 Logic Drive, San Jose, CA 95124.

Pecht, Michael, "Handbook of Electronic Package Design", Section 5.4, Aug. 16, 1991, 256-257 pp., Marcel Dekker, Inc., NY, NY, USA.

* cited by examiner

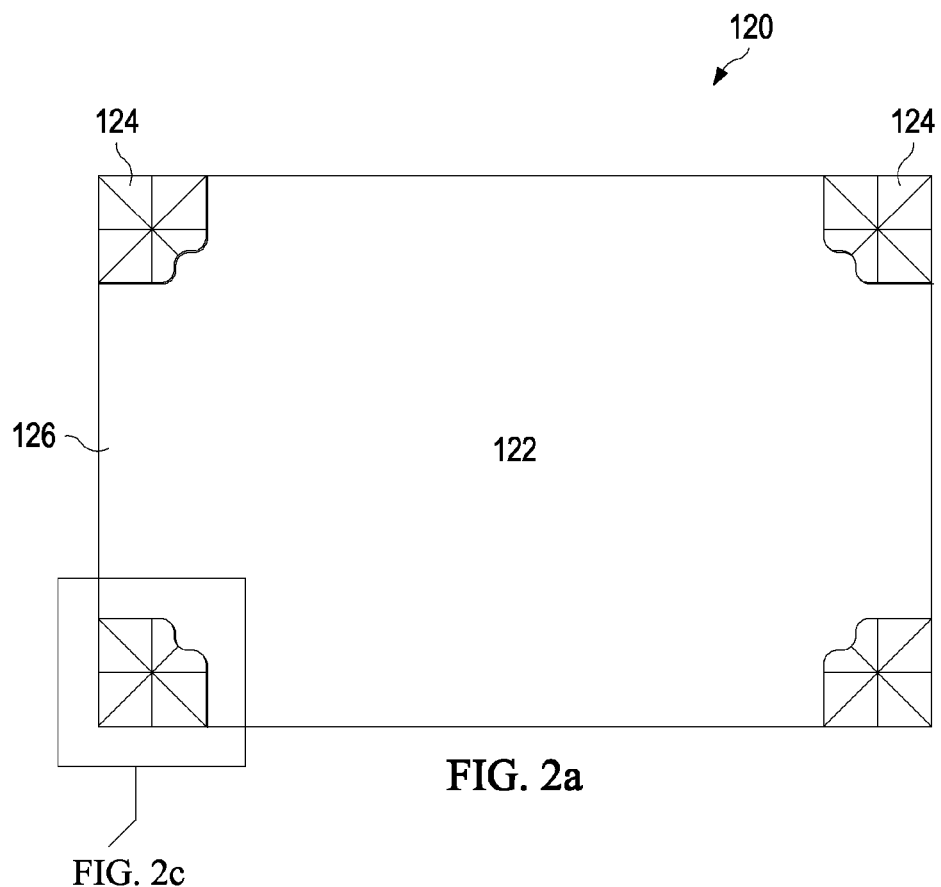
FIG. 2a
FIG. 2c
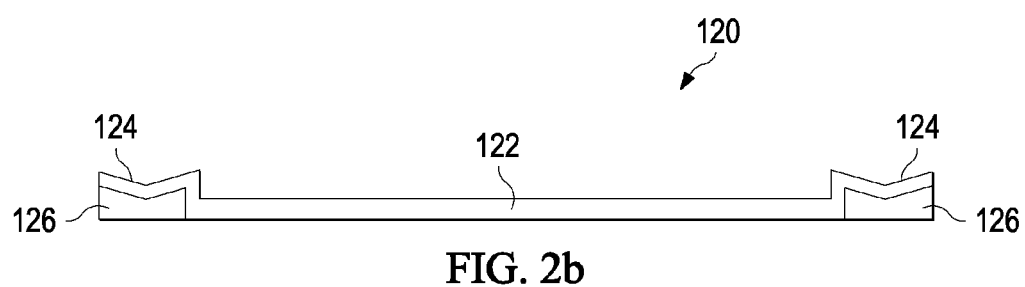
FIG. 2b

INTEGRATED CIRCUIT PACKAGING DEVICES AND METHODS

FIELD OF THE INVENTION

An embodiment of the invention relates generally to integrated circuit ("IC") devices and methods, and more particularly to integrated circuit packaging devices and methods.

BACKGROUND

Many integrated circuit packages, such as a ball grid array package containing a flip chip, typically include a lid disposed over an integrated circuit die and an underlying substrate. The lid may provide one or more benefits for the package, such as increasing thermal dissipation, protecting the die from outside elements, reducing electromagnetic radiation to or from the die, and providing physical support, e.g., for warpage control. The lid typically is attached using a thermal adhesive that couples the lid to the die and substrate, and provides for heat transfer. Some lids are attached to the substrate around the full perimeter of the lid. Other lids provide legs for attachment to the substrate, with openings between the legs permitting limited access to the area between the lid and the substrate.

SUMMARY

Problems in the prior art are generally solved or circumvented, and technical advantages are generally achieved, by one or more embodiments of the present invention which provide a semiconductor chip package lid having non-planar feet. The lid may be attached to a package substrate using a relatively high modulus adhesive. Further, a thermal interface material may be used to thermally couple the lid and the semiconductor chip.

In accordance with an embodiment of the present invention, an integrated circuit package includes a package substrate having an array of top electrical contacts disposed on its top surface, and an array of bottom electrical contacts disposed on its bottom surface, and a semiconductor die disposed on the package substrate. The semiconductor die has an array of die electrical contacts disposed on its bottom surface, wherein the die electrical contacts are bonded to the package substrate top electrical contacts by a first ball grid array, and wherein a perimeter of the semiconductor die is spaced inwardly from a perimeter of the package substrate such that a perimeter region of the package substrate is not covered by the semiconductor die. A lid has a planar main body disposed on the semiconductor die, and has legs located at corners of the main body disposed on corners of the perimeter region of the package substrate, wherein each of the legs has a non-planar bottom surface, and wherein a perimeter of the lid main body extends over sides of the perimeter region between the corners of the perimeter region. An inelastic adhesive mechanically attaches the non-planar bottom surface of each lid leg to the perimeter region of the package substrate, and a thermal interface material is disposed between and thermally couples a bottom surface of the lid main body and a top surface of the semiconductor die.

In accordance with another embodiment of the present invention, a method of forming an integrated circuit package includes surface mounting a bottom surface of a semiconductor die to a top surface of a package substrate, wherein die electrical contacts on the bottom surface of the semiconductor die are electrically connected to top electrical contacts on the top surface of the package substrate. The method further includes applying a thermal interface material to a top surface of the semiconductor die or to a bottom surface of a main body of a lid, the lid comprising legs disposed at corners of the main body. The method further includes using an inelastic adhesive to mechanically bond a bottom surface of each of the legs to a respective corner of the top surface of the package substrate outside a perimeter of the semiconductor die, wherein each of the legs has a non-planar bottom surface, wherein the thermal interface material thermally couples the bottom surface of the lid main body to the top surface of the semiconductor die.

In accordance with another embodiment of the present invention, an integrated circuit package lid includes a planar rectangular main body having a bottom surface, and a leg disposed at each corner of the main body and within a perimeter of the main body, wherein each leg has a wall projecting downwardly from the main body, wherein each leg has a non-planar bottom surface disposed at a bottom of the wall, wherein the non-planar bottom surface faces a same direction as the main body bottom surface, and wherein the lid is a single piece of material comprising the main body and legs.

BRIEF DESCRIPTION OF THE DRAWINGS

For a more complete understanding of the present invention, and the advantages thereof, reference is now made to the following descriptions taken in conjunction with the accompanying drawing, in which:

FIGS. 1c-1e are bottom, side and isometric views of a portion of the lid in FIG. 1a;

FIGS. 2a-2b are bottom plan and side views of a semiconductor package lid;

FIGS. 2c-2d are bottom and isometric views of a portion of the lid in FIG. 2a;

FIGS. 3a-3b are bottom and side views of an alternative for the portion of the lid in FIG. 2a;

FIGS. 4a-4b are alternative bottom and isometric views of an alternative for the portion of the lid in FIG. 2a;

FIGS. 5a-5b are alternative bottom and isometric views of an alternative for the portion of the lid in FIG. 2a;

DETAILED DESCRIPTION

Figure 1A:
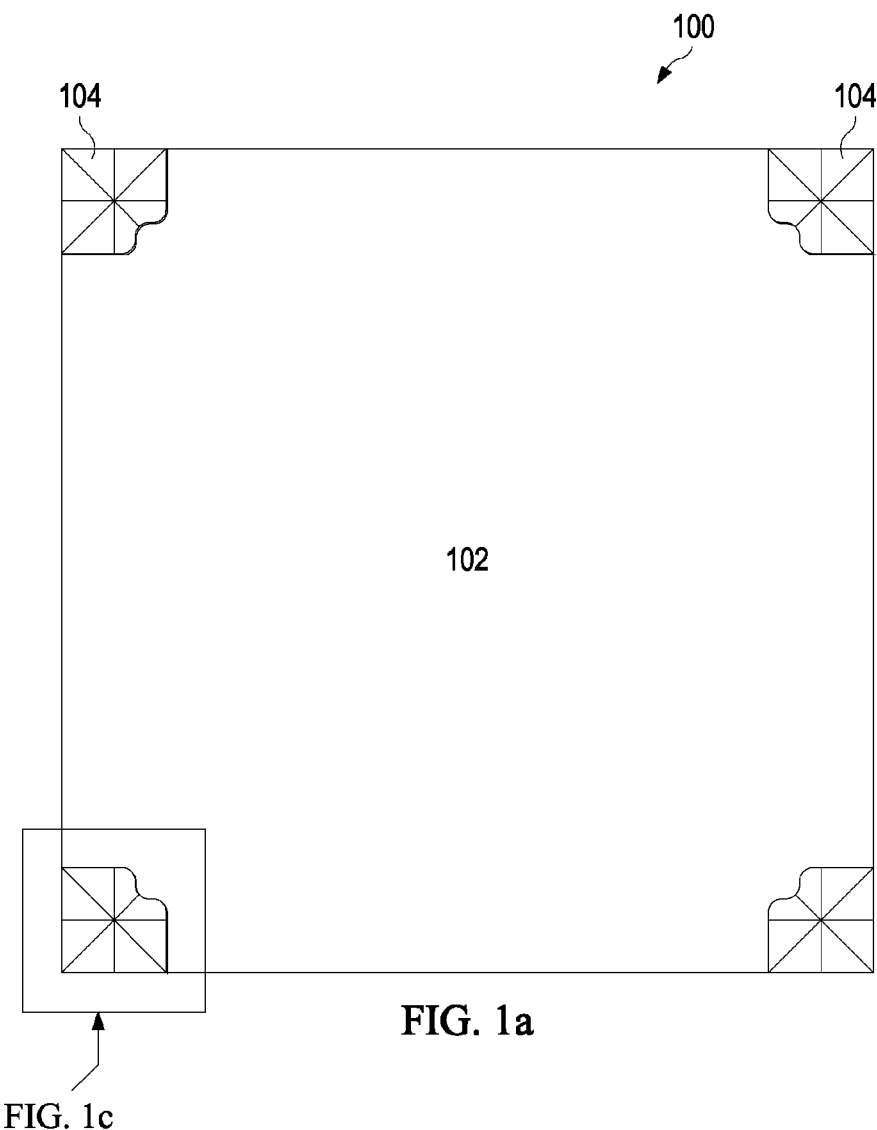
FIGS. 1a-1b are bottom plan and side views of a semiconductor package lid.

The making and using of some embodiments of the present invention are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a ball grid array integrated circuit package incorporating a flip chip. The invention also may be applied, however, to other types of semiconductor packages having different types of chip to package substrate mounting as well as different types of package substrate to circuit board mounting. For example, other surface mount methods may be used for both the chip to package substrate mount and the package substrate to printed circuit board mount. As another example, the chip may have the contacts mounted on either the frontside or the backside.

Ball grid array ("BGA") integrated circuit ("IC") packaging generally provides good thermal performance by thermally coupling a lid to the backside of an IC bonded to a package substrate. The semiconductor chip or die is flipped over and contacts on the frontside of the chip are electrically connected to contacts on the package substrate using solder bumps. The BGA package substrate typically has another set of solder bumps on the bottom of the package substrate that connect to an array of contacts on a printed circuit assembly or printed circuit board ("PCB"). The BGA package substrate generally includes conductive traces that couple the relatively fine-pitch array of contacts on the IC to an array of contacts on the printed circuit assembly, which has a relatively coarse pitch.

These types of lids, however, often exhibit the problem of separating from the top of an integrated circuit package. Because the adhesion strength of the adhesive used to attach the lid is sometimes not strong enough to hold the lid to the package, the conductive lid may come off of the package. Generally, proper material construction and processing of the lid, the package, and the adhesive is required so that the lid will stay attached to the package during assembly and long term field usage. Degradation of adhesion may be caused by many factors, including shear stresses induced due to thermal expansion/shrinkage differences at the interfaces, push/pull stresses induced due to warping of the silicon, package, and/or board, adhesive degradation due to chemical exposure, etc. Excessive component handling stresses, such as excessive torque, pressure or g-shock during test, assembly, rework, and field use also may result in separation of the lid from the package.

Currently, a wide variety of components, such as FPGA, ASIC, graphics, microprocessors, and the like, employ flip chip BGA packages. The small size and increasing electronic content of many devices, such as mobile phones, personal digital assistants, portable computers, and the like, constrains the overall size of integrated circuit packages. In addition, as the requirements of large size silicon chips and/or passive devices used in packages increase, a smaller bond area is used to bond the lid to the substrate. In a high performance flip chip package, the silicon device and passives such as chip capacitors and resistors may occupy significant substrate real-estate for enhanced electrical performance. With the limits imposed on the overall size of the package substrate, very limited space may be left for placement of a lid for achieving high mechanical and thermal performance. The smaller bond area available for bonding the lid to the substrate further reduces adhesion of the lid to the substrate, and may lead to lid delamination when subjected to post assembly thermal and mechanical stresses.

A lid with a full perimeter continuous foot provides full perimeter adhesion, but reduces the real estate space available for mounting passive devices around the semiconductor chip or die. A full perimeter lid also effectively prohibits access to the area enclosed the lid and the substrate. Alternatively, four-post lids may be used on packages that do not have space for full perimeter lid attachment. The openings between the feet at the perimeter of the package substrate leave room for mounting passive devices. The limited real estate available to couple the lid to the substrate, however, generally exacerbates the problem of attaining sufficient lid adhesion and reliability. Because the coupling surface area between the lid and substrate is significantly reduced, the support provided to the packages also may be proportionally reduced.

Generally, the lid to adhesive interface is one of the weaker interfaces for adhesion in the package. One embodiment for increasing adhesion is to increase the surface area of the bottom surface of the lid's feet. Another approach for increasing adhesion is the use of a relatively inelastic or high modulus of elasticity adhesive. For example, a high modulus epoxy based material generally will provide sufficient adhesion and package stability. Prior art thermal interface materials ("TIM"s) generally tend to be silicone based materials that are more elastic or flexible than epoxy based materials. As such, the support provided by such a material is inferior to that provided by a relatively inelastic or inflexible adhesive such as an epoxy adhesive. Non-thermal interface materials, in general, tend to be relatively inelastic.

Figure 1B:
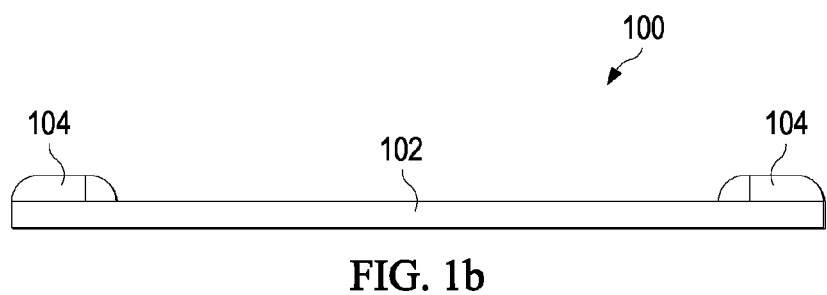

An embodiment four-leg semiconductor package lid is illustrated in FIGS. 1a-1e. Lid 100 may be formed by, for example, milling or forging, and may contain a metal, metal alloy, or metal compound such as copper, nickel, nickel-plated copper, aluminum, aluminum carbide, and the like. FIG. 1a is a bottom plan view of lid 100, while FIG. 1b is a side view with the feet facing up. Lid 100 is shown in a square configuration, but may be rectangular or other geometric shapes. The specific shape and dimensions of the lid for a given application generally is driven by the shape of the package substrate to which it will be attached. The metal surface of lid 100 may be smooth, slightly roughened, brushed, polished, etc.

Lid 100 includes main body or main plate 102, which is generally planar and has a lower surface that thermally couples to the underlying semiconductor chip or die. Main body 102 may be completely planar, or may have raised or depressed features on either the top or bottom side. Generally, the area that contacts the semiconductor chip (via a thermally conductive material) is planar. This planar area may be the same height as, higher than, or lower than the surrounding perimeter area of the lid.

Lid 100 also includes four legs or feet 104 disposed at each corner of the lid. Each foot 104 has a non-planar bottom surface that is used to bond the lid to the underlying package substrate. Generally, the foot bottom has a non-planar surface such that it has no planar surface parallel to the main body of the lid, or to the package substrate when the lid is mounted. In this embodiment, the feet may be considered to either extend from the top surface of the main body, or from the bottom surface of the main body. Generally, the non-planar bottom surface of the lid foot increases coupling surface area of the foot while maintaining the same x and y dimensions as a comparable planar foot. Thus, even when reduced substrate coupling area is available due to space constraints, the non-planar foot provides increased adhesion capability over a planar foot.

Figure 1C:
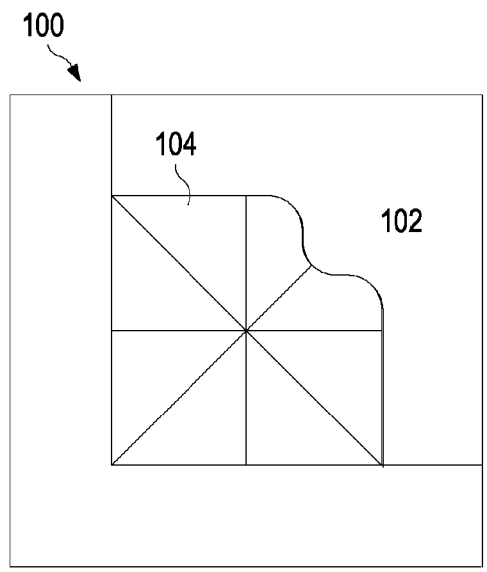
Figure 1D:
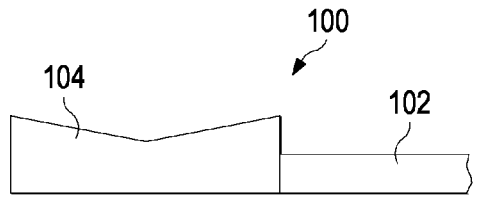
Figure 1E:
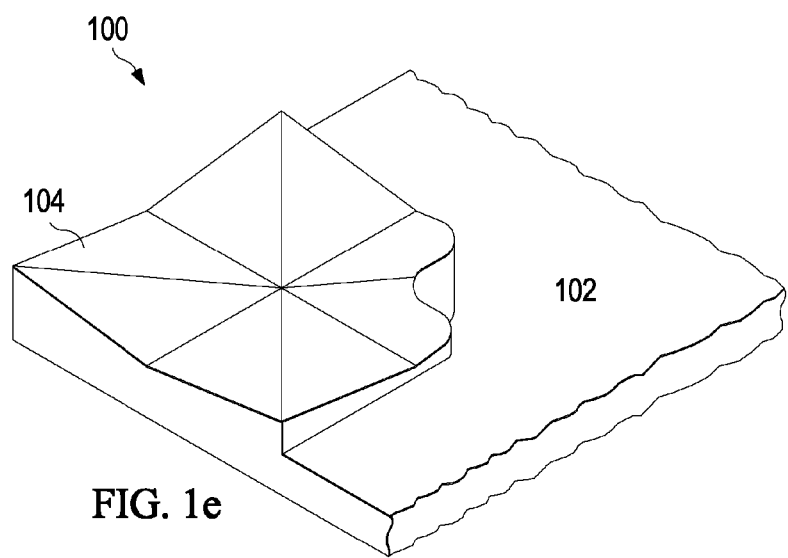

FIGS. 1c-1e illustrate closer views of one of the feet 104 on lid 100 from FIGS. 1a and 1b. FIG. 1c is a bottom planar view, FIG. 1d is a side view, and FIG. 1e is an isometric view of foot 104. These figures better illustrate the non-planarity of the bottom surface of foot 104. In this embodiment, foot 104 has a multi-faceted lower surface in which no planes are parallel to main body 102 of lid 100. As can be seen in FIG. 1e, the multi-faceted bottom surface has increased surface area compared to a same-size foot with a single planar bottom surface.

Figure 2C:
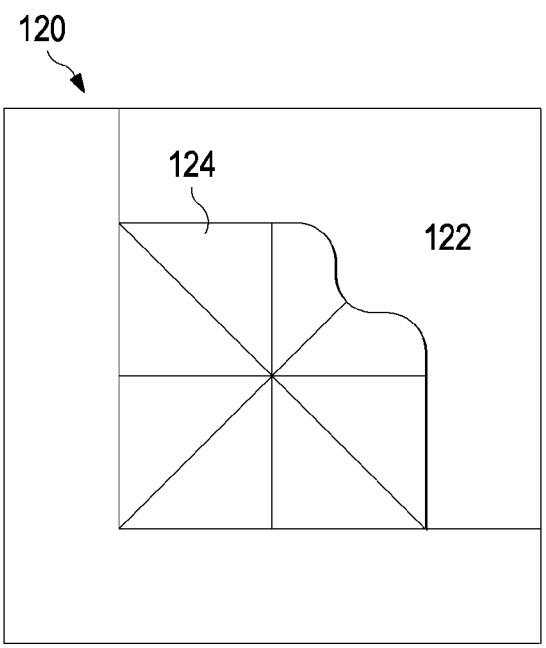

Another embodiment of a four-leg semiconductor package lid is illustrated in FIGS. 2a-2d. Lid 120 may be formed by, for example, stamping or pressing, and may contain a metal, metal alloy, or metal compound such as copper, nickel, nickel-plated copper, aluminum, aluminum carbide, and the like. FIG. 2a is a bottom plan view of lid 120, while FIG. 2b is a side view with the feet facing up. Lid 120 is shown in a rectangular configuration, but may be other geometric shapes. The specific shape and dimensions of the lid for a given application generally is driven by the shape of the package substrate to which it will be attached. The metal surface of lid 120 may be smooth, slightly roughened, brushed, polished, etc.

Lid 120 includes main body 122, which is generally planar and has a lower surface that thermally couples to the underlying semiconductor chip. Main body 122 may be completely planar, or may have raised or depressed features on either the top or bottom side. Generally, the area that contacts the semiconductor chip (via a thermally conductive material) is planar. This planar area may be higher or lower than the surrounding perimeter area 126 of the lid.

Lid 120 also includes four feet 124 formed on each corner of the lid. Each foot 124 has a non-planar bottom surface that is used to bond the lid to the underlying package substrate. Generally, the foot bottom has a non-planar surface such that it has no planar surface parallel to the main body of the lid, or to the package substrate when the lid is mounted. In this embodiment, the lid is stamped from a single sheet of metal, such that the feet are displaced from the plane of the main body, and there are sloped or vertical walls connecting the foot to the main body. Generally, the non-planar bottom surface of the lid foot increases coupling surface area of the foot while maintaining the same x and y dimensions as a comparable planar foot. Thus, even when reduced substrate coupling area is available due to space constraints, the non-planar foot provides increased adhesion capability over a planar foot.

Figure 2D:
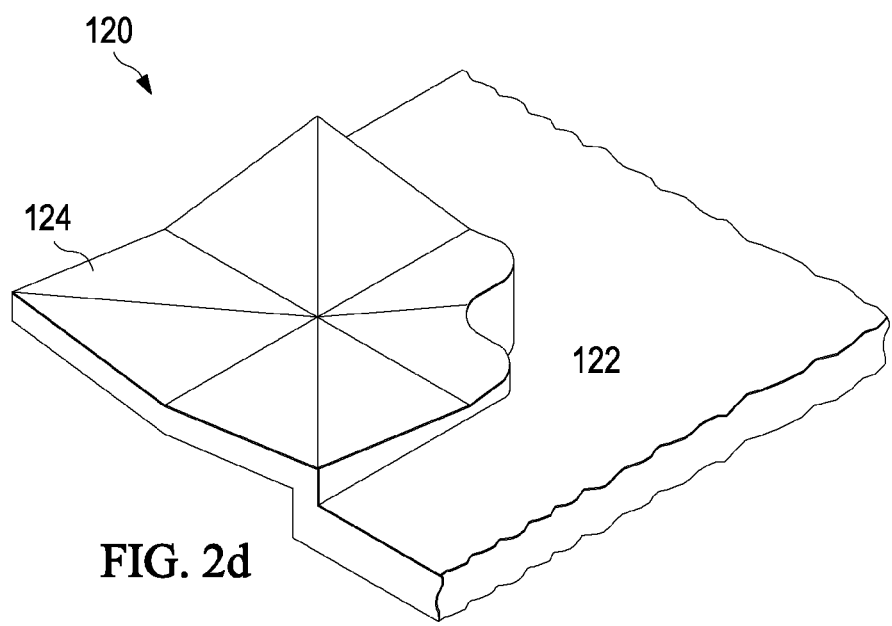

FIGS. 2c-2d illustrate closer views of one of the feet 124 on lid 120 from FIGS. 2a and 2b. FIG. 2c is a bottom planar view and FIG. 2d is an isometric view of foot 124. These figures better illustrate the non-planarity of the bottom surface of foot 124. In this embodiment, foot 124 has a multi-faceted lower surface in which no planes are parallel to main body 122 of lid 120. As can be seen in FIG. 2d, the multi-faceted bottom surface has increased surface area compared to a same-size foot with a single planar bottom surface.

Figure 3A:
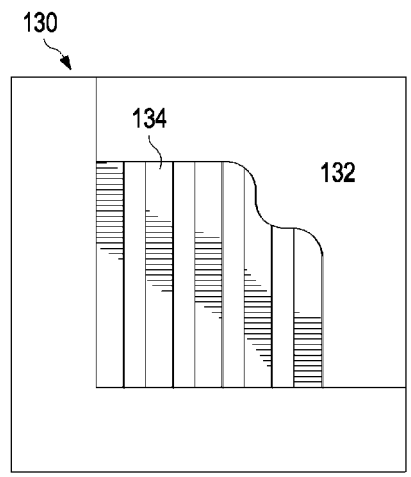
Figure 3B:
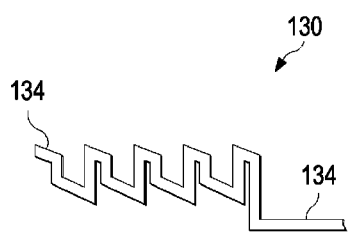

There are many different non-planar configurations for the bottom surface of the lid leg that provide increased surface area of the leg's contact points to the substrate, examples of which are provided in FIGS. 3-5. FIGS. 3a-3b illustrate an alternative embodiment for the bottom surface of a leg. In these figures, a partial view of lid 130 includes main body 132 and leg 134. FIG. 3a is a bottom planar view and FIG. 3b is a side view of leg 134. In this embodiment, leg 134 has multiple ridges stamped into the lower surface of the leg such that no surface is parallel to main body 132 of lid 130. As can be seen in FIG. 3b, the ridged bottom surface has increased surface area compared to a same-size foot with a single planar bottom surface.

Figure 4A:
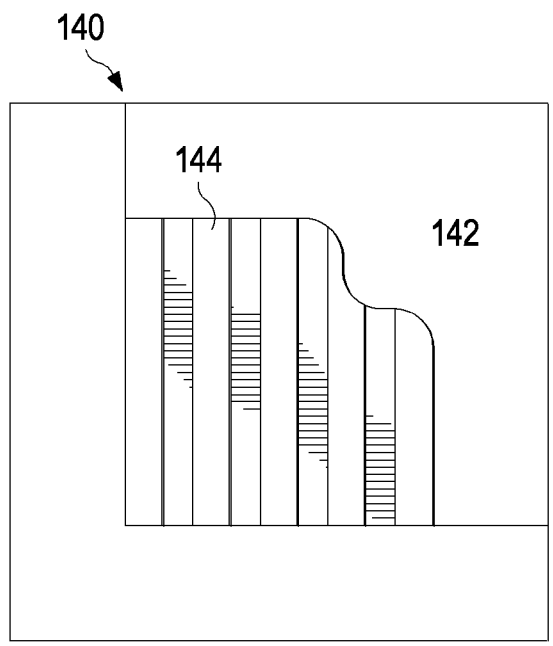
Figure 4B:
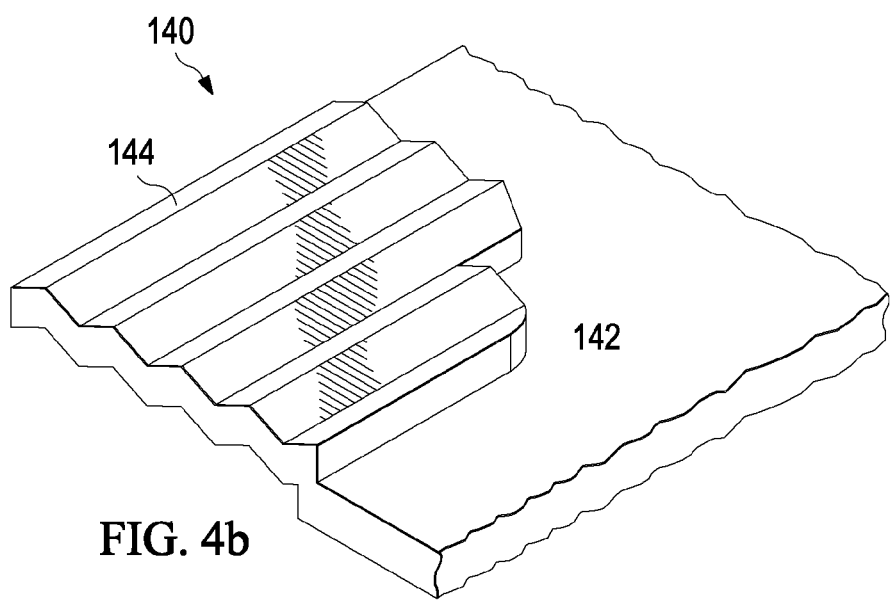

FIGS. 4a-4b illustrate an alternative embodiment for the bottom surface of a leg. In these figures, a partial view of lid 140 includes main body 142 and leg 144. FIG. 4a is a bottom planar view and FIG. 4b is an isometric view of leg 144. In this embodiment, leg 144 has multiple angled ridges stamped into the lower surface of the leg such that no surface is parallel to main body 142 of lid 140. As can be seen in FIG. 4b, the ridged bottom surface has increased surface area compared to a same-size foot with a single planar bottom surface.

Figure 5A:
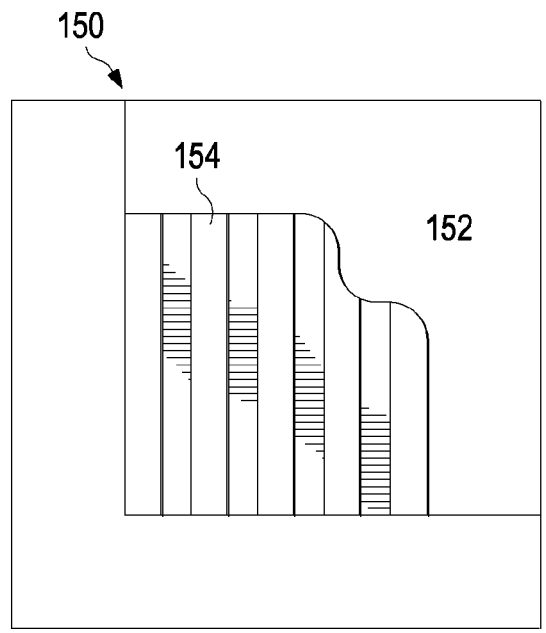
Figure 5B:
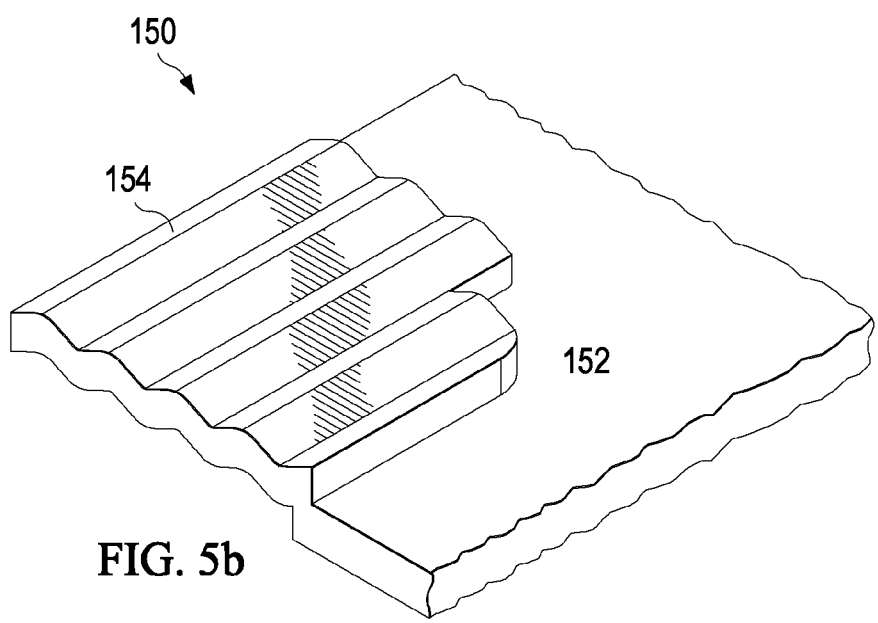

FIGS. 5a-5b illustrate an alternative embodiment for the bottom surface of a leg. In these figures, a partial view of lid 150 includes main body 152 and leg 154. FIG. 5a is a bottom planar view and FIG. 5b is an isometric view of leg 154. In this embodiment, leg 154 has multiple wavy or curved ridges stamped into the lower surface of the leg such that no surface is parallel to main body 152 of lid 150. As can be seen in FIG. 5b, the ridged bottom surface has increased surface area compared to a same-size foot with a single planar bottom surface.

Any of the leg bottom surfaces shown in FIGS. 3-5 may be utilized in the embodiment of FIG. 1. As an alternative to the different types of ridges shown in FIGS. 3-5, the bottom of a foot may have the same pattern in both the x and y directions to form a checkered instead of ridge pattern.

Furthermore, it should be noted that embodiments are not limited only to lids that have four legs or posts. The various embodiments for the bottom surface of a foot also may be applied to lids that have a full perimeter coupling area. Alternatively, the lid may have full length coupling area on two sides of the lid, leaving the other two sides open. Conversely, the package lid may have more or less than four feet. Additional feet may be placed between the four corner feet along the sides of the package. For example, the lid may have an additional foot disposed along each of two opposite sides of the lid for a total of six feet, or may have an additional foot along each of all four sides of the lid for a total of eight feet. Generally, a lid with four legs provides a good balance of adhesion and support along with open space for access, venting and reduced moisture buildup.

Figure 6A:
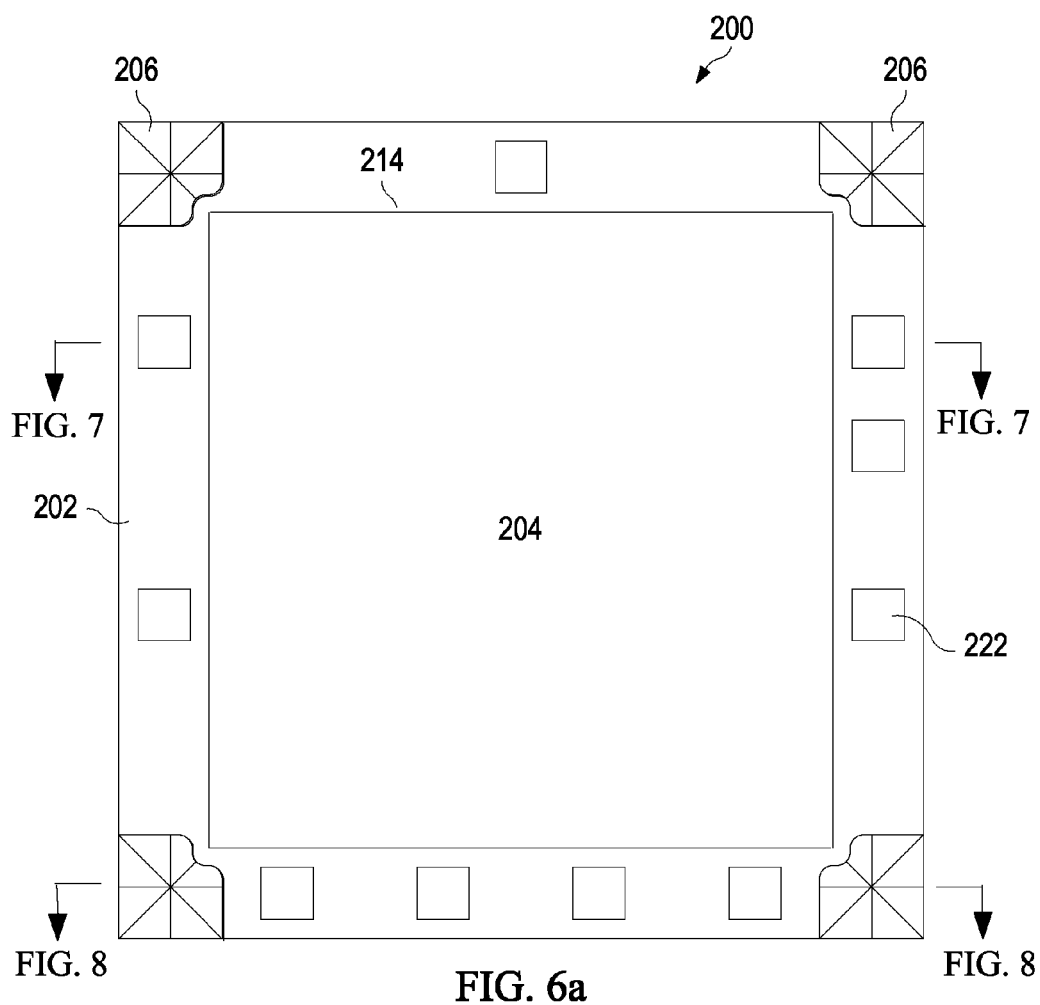
FIGS. 6a-6b are top plan and side views of an assembled semiconductor package.
Figure 6B:
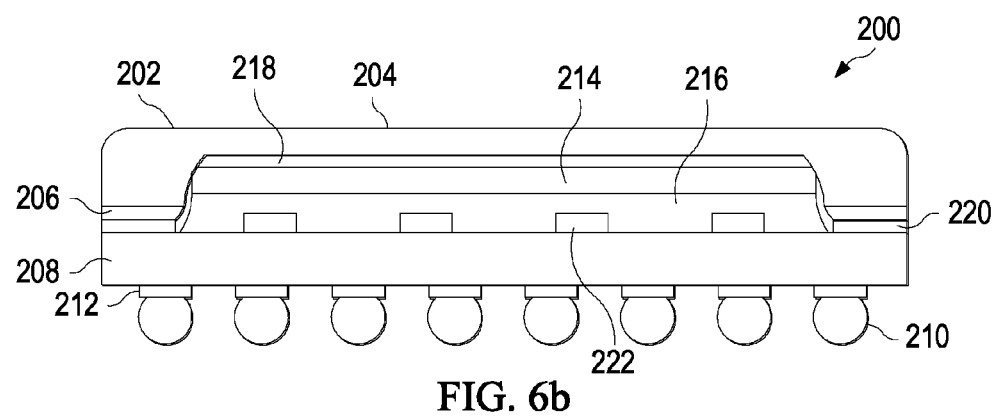

FIGS. 6a-6b illustrate an assembled integrated circuit package 200 including a lid 202 with a planar main body 204 and legs 206 having non-planar bottom surfaces. FIG. 6a is a top plan view and FIG. 6b is a side view of the assembled package. Package 200 also includes package substrate 208 having a solder ball grid array 210 disposed on package contacts 212 on the substrate bottom surface for connection to a printed circuit board.

The dotted line in FIG. 6a shows the outline of semiconductor chip or die 214 that is located below the lid. Chip 214 is bonded to substrate 208 via a ball grid array that is not visible behind underfill 216. A thermally conductive material is disposed on top of chip 214 thermally coupling the backside of chip 214 to the main body 204 of lid 202. Inelastic or high modulus adhesive 220 bonds each of the four legs 206 to the substrate 208. The side edges of lid 202 between the corner legs 206 are in the same plane as the main body 204, providing an opening on each side of the package between the lid 202 and the substrate 208. Chip capacitors 222 visible in FIG. 6b are bonded to the package substrate 208 around the perimeter of chip 214 in these openings. FIG. 6a illustrates the dotted outlines of two chip capacitors on one side of the package, as an example.

The inflexible high modulus adhesive 220 mechanically bonding the lid legs to the package substrate provides reinforcement of the IC package. Increased adhesion is provided by both the non-planar leg bottom surfaces and the use of the inelastic high modulus adhesive. A semiconductor chip package having non-planar leg bottom surfaces and a high modulus adhesive attaching the legs to the package substrate generally provides a structurally robust IC package with warpage control, rigidity and reliability.

While the package in FIGS. 6a-6b illustrate a single chip mounted on a single substrate with a single lid covering the chip, other embodiments may include two or more chips mounted to a substrate with a single lid covering the two or more chips. The chips may be mounted side by side, or may be mounted in a stacked configuration. Furthermore, two or more chips may be mounted on a single substrate and have an individual lid covering each chip.

FIGS. 7a-7f are cross-sectional views taken at line 7-7 of various stages in the assembly of the package shown in FIG.

6. Likewise, FIGS. 8a-8c are cross-sectional views taken at line 8-8 of various stages in the assembly of the package shown in FIG. 6.

Figure 7A:
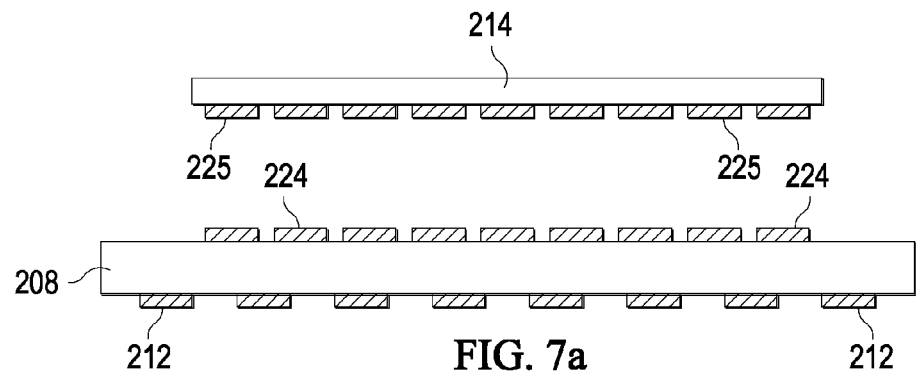
FIGS. 7a-7f are cross-sectional views taken at line 7-7 of various stages in the assembly of the package shown in FIG. 6.
Figure 7B:
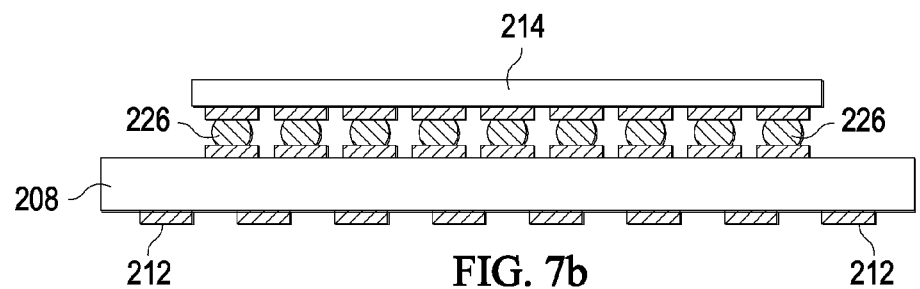
Figure 7C:
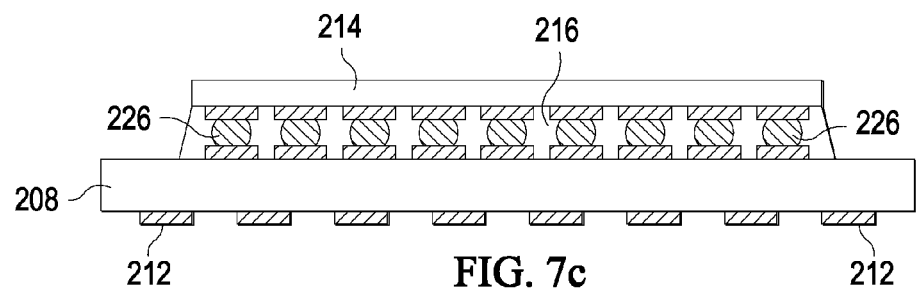

In FIG. 7a, package substrate is shown with a grid array of package contacts 212 on its bottom side and a grid array of chip contacts 224 on its top side. The substrate may be a printed circuit board with internal traces and vias connecting the two arrays of contacts. FIG. 7a additionally shows chip 214 with a grid array of contacts 225 on its flipped front side. Alternatively, the chip contacts may be disposed on the backside of the chip. In FIG. 7b, contacts 225 of chip 214 are electrically bonded to contacts 224 of substrate 208 with an array of solder bumps 226. In FIG. 7c, an underfill layer 216, typically an epoxy-based material, is applied around and between the solder balls 226 to mechanically bond the chip 214 to the substrate 208 and to provide protection for the solder ball connections.

Figure 7D:
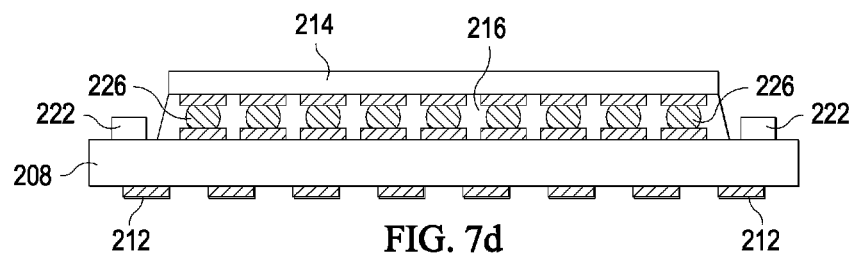
Figure 7E:
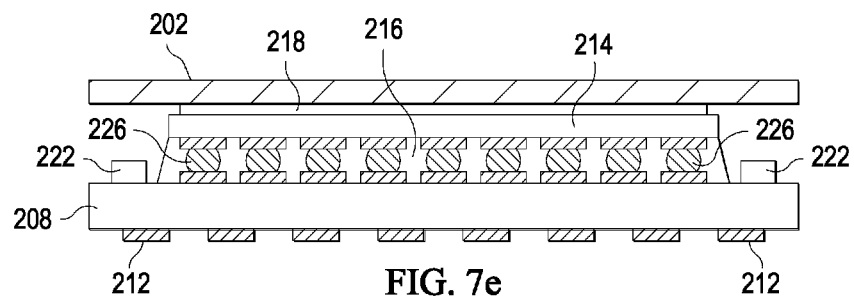
Figure 7F:
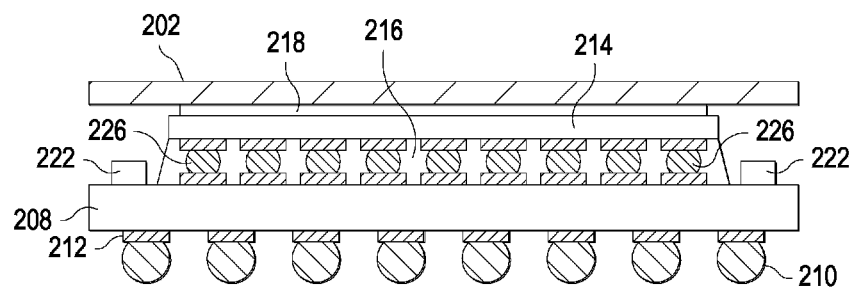
Figure 8A:
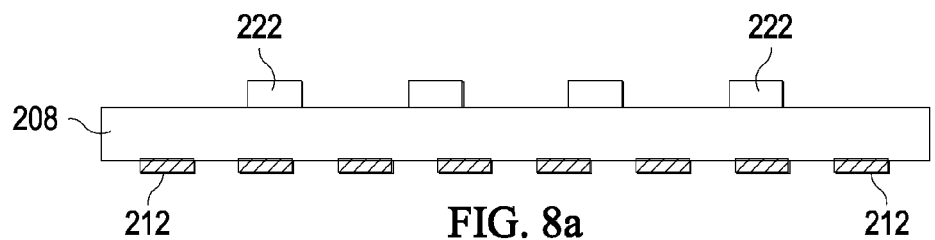
FIGS. 8a-8c are cross-sectional views taken at line 8-8 of various stages in the assembly of the package shown in FIG. 6.
Figure 8B:
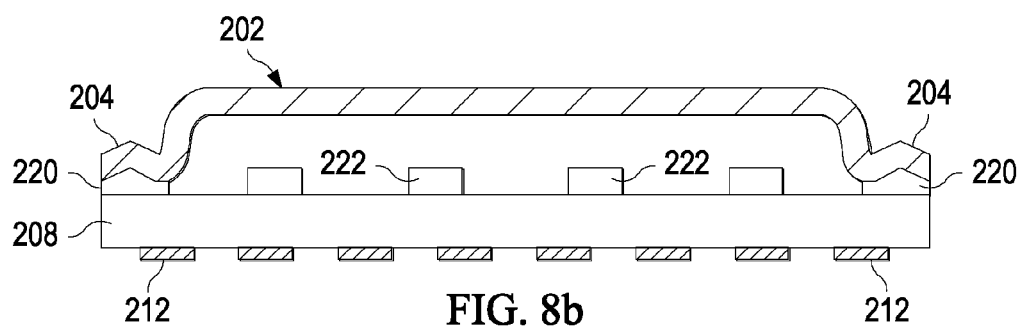
Figure 8C:
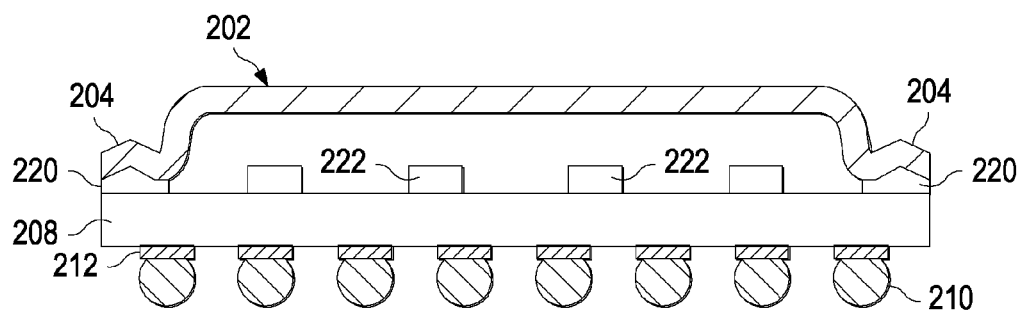

In FIGS. 7d and 8a, passive components 222, such as chip capacitors or resistors are disposed on contacts on the top surface of substrate 208. The passive components are placed around the perimeter of chip 214 and near the edge of the top of substrate 208, but not in the corners of the top surface of substrate 208. In FIGS. 7e and 8b, the lid 202 is attached to the assembly. Legs 206 of lid 202 are mechanically attached to substrate 208 with rigid epoxy 220, and the main body bottom surface of lid 202 is thermally coupled to chip 214 with thermal interface material 218. In FIGS. 7f and 8c, the package solder balls 210 are attached to the contacts 212 on the bottom of substrate 208.

The adhesive bonding the lid to the substrate may be selected from a variety of materials. A high modulus material generally is preferred, although in some applications, a lower modulus material may be used. The material may be a thermally-conductive thermal interface material, or a non-thermally-conductive non-thermal interface material. For example, a non-thermal interface material such as Ablestik MC723, available from Ablestik Laboratories of Rancho Dominguez, Calif., may be used to bond the lid to the substrate. This material has a modulus of about 3.3 GPa and thermal conductivity of about 0.8 W/MK. Alternatively, a different non-thermal interface material such as Ablestik 3003, with a modulus of about 4 GPa and thermal conductivity of about 1.0 W/MK, may be used to bond the lid to the substrate. The modulus of elasticity of the adhesive may be greater than about 1 GPa, preferably greater than about 2 GPa, and more preferably greater than about 3 GPa.

Alternatively, a thermal adhesive such as Shin-Etsu 9080 series, available from Shin-Etsu Chemical Co. of Tokyo, Japan, may be used to bond the lid to the substrate. As another alternative, Dow Corning SE4450 thermal adhesive, available from Dow Corning Corp. of Midland, Mich., may be used for the lid to substrate bond.

The thermal interface material used between the lid and the chip also may be selected from a variety of materials. If the lid-to-substrate adhesive is a thermal interface material, then the same material may be used to bond the lid to the chip backside. Alternatively, different materials may be used for the lid leg-to-substrate bond and the lid main body-to-chip interface. If a non-thermal interface material is used for the lid-to-substrate bond, then a thermal interface material may be used for the lid-to-chip thermal coupling. For example, a thermal grease or Ablestik MG121 may be used for the lid-to-chip thermal interface material.

Figure 9:
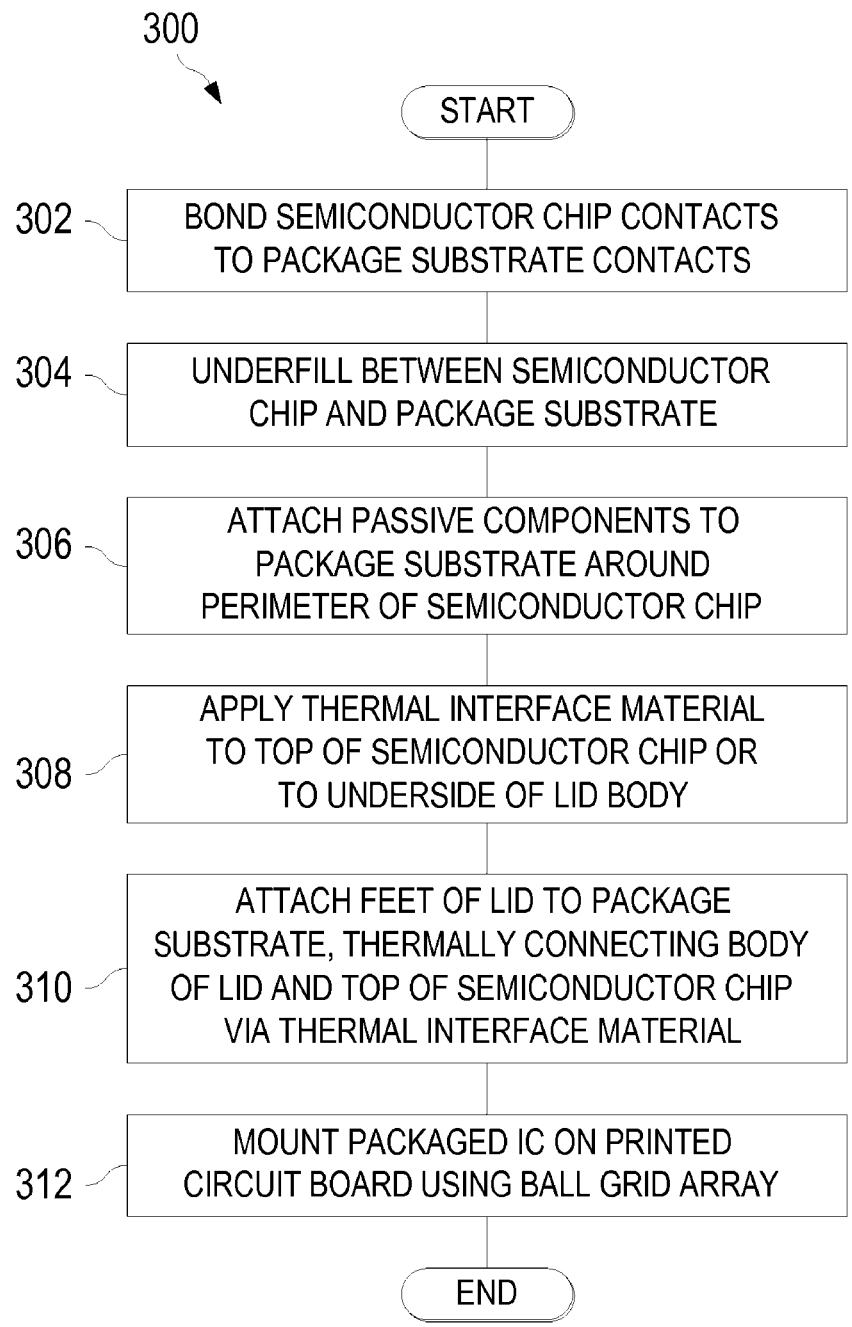
FIG. 9 is a flow chart of the assembly of a semiconductor package having a lid.

FIG. 9 is a flow chart 300 of the assembly of a semiconductor package having a lid. In step 302, the semiconductor chip contacts are electrically and mechanically bonded to the package substrate contacts on the top of the substrate with solder balls. In step 304, an underfill layer is disposed around the solder balls between the semiconductor chip and the package substrate. In step 306, passive components are attached to the package substrate on at least one side of the perimeter of semiconductor chip. In step 308, thermal interface material is disposed on the top of the semiconductor chip or on the underside of the lid main body. In step 310, the feet of the lid are bonded to the package substrate using a high modulus adhesive. Generally, the temperature and cure time for the adhesive depend on the specific adhesive selected for a particular application. Generally, the adhesive may be cured in an oven at an elevated temperature of about 100 degrees C. or higher for a period of about 10 or 15 minutes or more. For example, if Ablestik MC723 is used, the recommended cure time is 30 minutes at about 150 degrees C., and then 30 minutes at about 165 degrees C. The mechanical attachment of the lid to the substrate also thermally connects the body of the lid and top of semiconductor chip via the thermal interface material. In step 312, solder balls may be attached to contacts on the bottom surface of the substrate, and then the packaged IC may be mounted on a printed circuit assembly using the ball grid array.

Although the steps of forming the integrated circuit package are shown and described in a particular order, the steps need not be performed in the order shown. For example, the passive components 222 may be attached to the top surface of the substrate 208 at an earlier stage, such as before or at the same time that chip 214 is attached to the substrate. As another example, the solder ball array 210 may be attached to the bottom contacts 212 of substrate 208 before the lid is attached to the substrate.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit package comprising:
    a package substrate having an array of top electrical contacts disposed on its top surface, and an array of bottom electrical contacts disposed on its bottom surface;
    a semiconductor die disposed on the package substrate, the semiconductor die having an array of die electrical contacts disposed on its bottom surface, wherein the die electrical contacts are bonded to the package substrate top electrical contacts by a first ball grid array, and wherein a perimeter of the semiconductor die is spaced inwardly from a perimeter of the package substrate such that a perimeter region of the package substrate is not covered by the semiconductor die;
    a lid having a planar main body disposed on the semiconductor die, and having legs located at corners of the main body disposed on corners of the perimeter region of the package substrate, wherein each of the legs has a non-planar, multi-faceted bottom surface that is divided into a plurality of portions, each of the plurality of portions having a plurality of planes which is not parallel with the main body and extends from an outer edge of the leg toward a center of the leg, wherein the plurality of portions are formed at adjacent side portions of the leg at a corner of the perimeter region of the package substrate, the legs forming openings between adjacent legs on each side of the integrated circuit package and extending from the main body to the package substrate, and wherein a perimeter of the lid main body extends over sides of the perimeter region between the corners of the perimeter region;

an inelastic adhesive mechanically attaching the non-planar, multi-faceted bottom surface of each lid leg to the perimeter region of the package substrate; and a thermal interface material disposed between and thermally coupling a bottom surface of the lid main body and a top surface of the semiconductor die.

2. The integrated circuit package of claim 1, wherein the lid is a stamped single sheet of material comprising at least one metal.

3. The integrated circuit package of claim 1, wherein the inelastic adhesive is an epoxy-based material.

4. The integrated circuit package of claim 1, further comprising an underfill material disposed between the bottom surface of the semiconductor die and the top surface of the package substrate.

5. The integrated circuit package of claim 1, further comprising a passive component disposed on one of the sides of the perimeter region, and under the main body of the lid.

6. The integrated circuit package of claim 1, wherein the package substrate is a printed circuit board.

7. The integrated circuit package of claim 1, further comprising a second ball grid array disposed on the array of bottom electrical contacts on the bottom surface of the package substrate.

8. The integrated circuit package of claim 1, wherein the inelastic adhesive has a modulus greater than about 1.0 GPa.

9. An integrated circuit package lid comprising:
a planar rectangular main body having a bottom surface; and
a leg disposed at each corner of the main body and within a perimeter of the main body, wherein each leg has a wall projecting downwardly from the main body, wherein each leg has a non-planar, multi-faceted bottom surface disposed at a bottom of the wall and divided into a plurality of portions, each of the plurality of portions having a plurality of planes which is not parallel with the main body and extends from an outer edge of the leg toward a center of the leg, wherein the plurality of portions are formed at adjacent side portions of the leg at a corner of the leg, the legs forming openings between adjacent legs on each side of the integrated circuit package lid, and wherein the non-planar, multi-faceted bottom surface faces a same direction as the main body bottom surface, and wherein the lid is a single piece of material comprising the main body and legs.

10. The integrated circuit package lid of claim 9, wherein the non-planar, multi-faceted bottom surface of the legs comprises a series of ridges.

11. The integrated circuit package lid of claim 9, wherein the lid is single piece of stamped material comprising at least one metal.

12. The integrated circuit package lid of claim 9, wherein the lid is single piece of milled material comprising at least one metal.

13. The integrated circuit package lid of claim 9, wherein the lid comprises a material selected from the group consisting of: nickel, copper, aluminum, and combinations thereof.

14. The integrated circuit package of claim 1, wherein the plurality of portions comprises a plurality of quarter portions.

15. The integrated circuit package of claim 14, wherein each quarter portion of the plurality of quarter portions includes 2 non-parallel planes of the plurality of planes.

* * * * *